United States Patent
Weng et al.

(10) Patent No.: US 8,951,909 B2
(45) Date of Patent: Feb. 10, 2015

(54) INTEGRATED CIRCUIT STRUCTURE AND FORMATION

(71) Applicant: Taiwan Semiconductor Manufacturing Company Limited, Hsin-Chu (TW)

(72) Inventors: Cheng-Hui Weng, Hsinchu (TW); Chun-Chieh Lin, Taichung (TW); Hung-Wen Su, Jhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/801,676

(22) Filed: Mar. 13, 2013

(65) Prior Publication Data
US 2014/0264864 A1     Sep. 18, 2014

(51) Int. Cl.
*H01L 21/76*     (2006.01)
*H01L 21/768*     (2006.01)
*H01L 23/528*     (2006.01)

(52) U.S. Cl.
CPC ........ *H01L 21/76865* (2013.01); *H01L 23/528* (2013.01)
USPC .......................................... 438/633; 438/631

(58) Field of Classification Search
CPC .................... H01L 21/31051; H01L 21/76801
USPC ........................... 438/626, 631, 633, 643–645
See application file for complete search history.

(56) References Cited

U.S. PATENT DOCUMENTS

| | | | | |
|---|---|---|---|---|
| 6,358,832 B1* | 3/2002 | Edelstein et al. | | 438/612 |
| 6,383,917 B1* | 5/2002 | Cox | | 438/637 |
| 6,391,768 B1* | 5/2002 | Lee et al. | | 438/633 |
| 7,582,557 B2 | 9/2009 | Shih et al. | | |
| 7,977,791 B2 | 7/2011 | Chang et al. | | |
| 2007/0048991 A1* | 3/2007 | Shih et al. | | 438/597 |

OTHER PUBLICATIONS

Zantye, et al., "Chemical mechanical planarization for microelectronics applications", Jun. 11, 2004, P.B. Zantye et al. / Materials Science and Engineering R 45 (2004) 89-220.
Balakumar, et al., "Peeling and delamination in Cu/SiLK process during Cu-CMP", 2004, Retrieved on Feb. 20, 2013, http://www.sciencedirect.com/science/article/pii/S0040609004006339.

(Continued)

*Primary Examiner* — Telly Green
*Assistant Examiner* — Paul Patton
(74) *Attorney, Agent, or Firm* — Cooper Legal Group, LLC

(57) ABSTRACT

One or more integrated circuit structures and techniques for forming such integrated circuit structures are provided. The integrated circuit structures comprise a conductive structure that is formed within a trench in a dielectric layer on a substrate. The conductive structure is formed over a barrier layer formed within the trench, or the conductive structure is formed over a liner formed over the barrier layer. At least some of the dielectric layer, the barrier layer, the liner and the conductive structure are removed, for example, by chemical mechanical polishing, such that a step height exists between a top surface of the substrate and a top surface of the dielectric layer. Removing these layers in this manner removes areas where undesired interlayer peeling is likely to occur. A conductive cap is formed on the conductive structure.

20 Claims, 14 Drawing Sheets

(56) References Cited

OTHER PUBLICATIONS

Zantye, et al., Study of Slurry Selectivity and End Point Detections in Cu-CMP Process, Feb. 19-21, 2003 CMP-MIC Conference 2003 IMIC—800P/00/0378, pp. 378-385.

Lai, Jiun Yu, "Mechanisms of Material Removal in the CMP Process", Publisher: Massachusetts Institute of Technology, Publication Feb. 2001, pp. 75-132, http://web.mit.edu/cmp/publications/thesis/jiunyulai/totalthesis.pdf.

* cited by examiner

INTEGRATED CIRCUIT STRUCTURE AND FORMATION

BACKGROUND

Integrated circuit fabrication can comprise a front-end-of-line process where, for example, one or more electrical devices, such as transistors, capacitors, resistors, etc., are patterned onto a semiconductor wafer. Integrated circuit fabrication can comprise a back-end-of-line process where, for example, electrical devices are interconnected on the semiconductor wafer.

DETAILED DESCRIPTION

Figure 1:
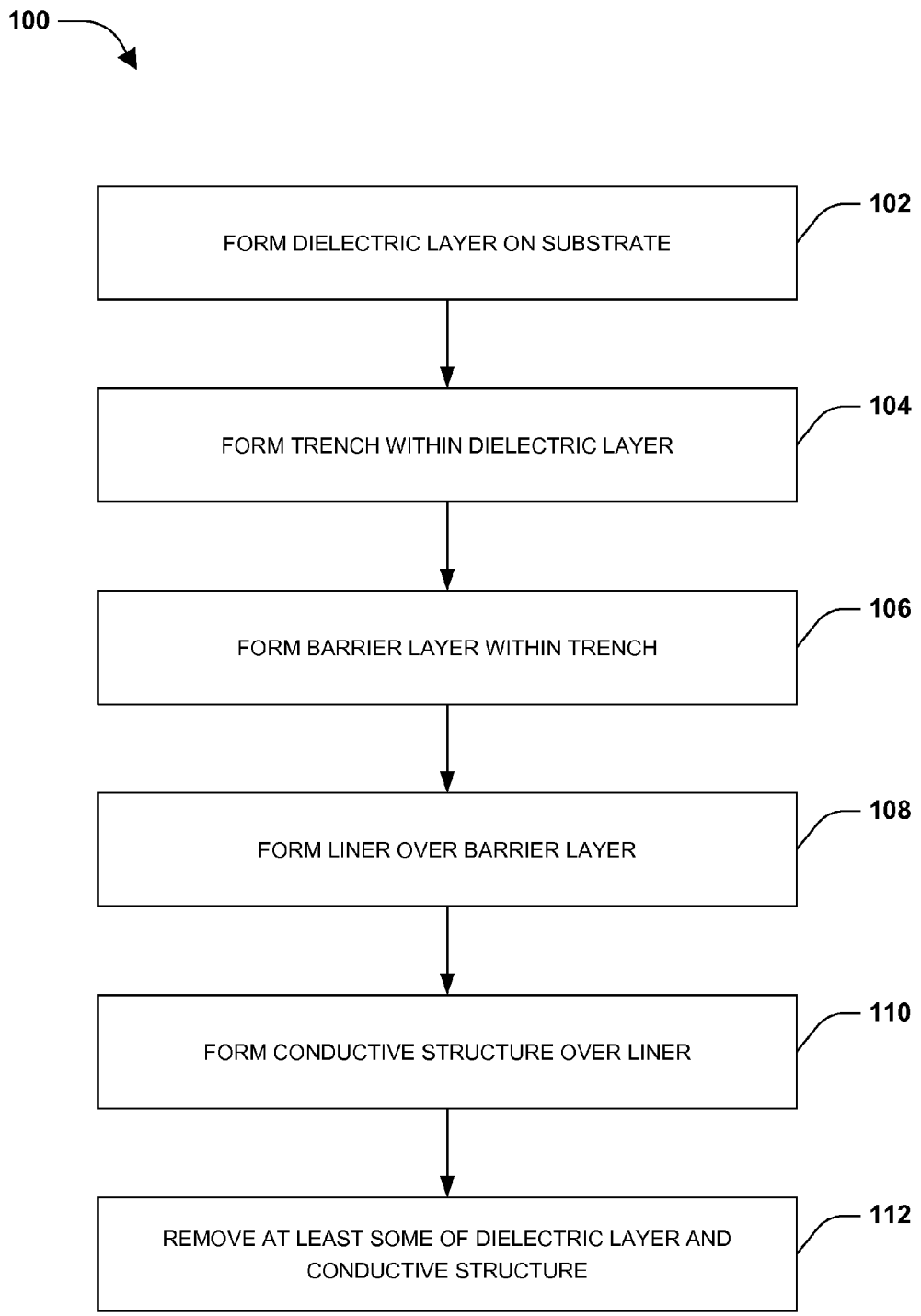
FIG. 1 is a flow diagram illustrating a method of forming an integrated circuit structure, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more integrated circuit structures and one or more techniques for forming such integrated circuit structures, such as during a back-end-of-line process or during a front-end-of-line process, for example, are provided herein. An integrated circuit structure is formed with a dielectric layer, such as a low-k layer, as well as a barrier layer and a liner that generally envelops a conductive structure, such as a copper via. A process, such as a chemical mechanical polishing (CMP) process, for example, results in a removal of at least some of at least one of the dielectric layer, the conductive structure, the barrier layer, or the liner. For example, a slurry is applied during the CMP process, and the slurry removes at least some of the dielectric layer at a first removal rate, while the slurry removes at least some of the conductive structure at a second removal rate. In some embodiments, the removal results in a decrease or elimination of peeled portions of the conductive structure, the dielectric layer, the barrier layer or the liner. Prior to the removal, a top surface of the dielectric layer and a top surface of the conductive structure have a substantially similar level. After the removal, the top surface of the dielectric layer is substantially higher or lower than the top surface of the conductive structure, for example, depending upon whether the first removal rate is greater than or less than the second removal rate. For example, if the first removal rate is greater than the second removal rate, the top surface of the dielectric layer is substantially lower than the top surface of the conductive structure, while if the first removal rate is less than the second removal rate, the top surface of the dielectric layer is substantially higher than the top surface of the conductive structure. A conductive cap is formed on the conductive structure. A conformal film is formed on the conductive cap and the dielectric layer.

A method 100 of forming an integrated circuit structure, according to some embodiments, is illustrated in FIG. 1, and one or more integrated circuit structures formed by such a methodology are illustrated in FIGS. 3-14. At 102, a dielectric layer 402, such as a low-k layer comprising a low-k material, is formed on a substrate 302 of an integrated circuit structure, as illustrated in example 300 of FIG. 3 and example 400 of FIG. 4. In some embodiments, the dielectric layer 402 has a low dielectric constant (k value), such as a value of about 3.8 or below, and comprises carbon, hydrogen, oxygen, or combinations thereof.

Figure 5:
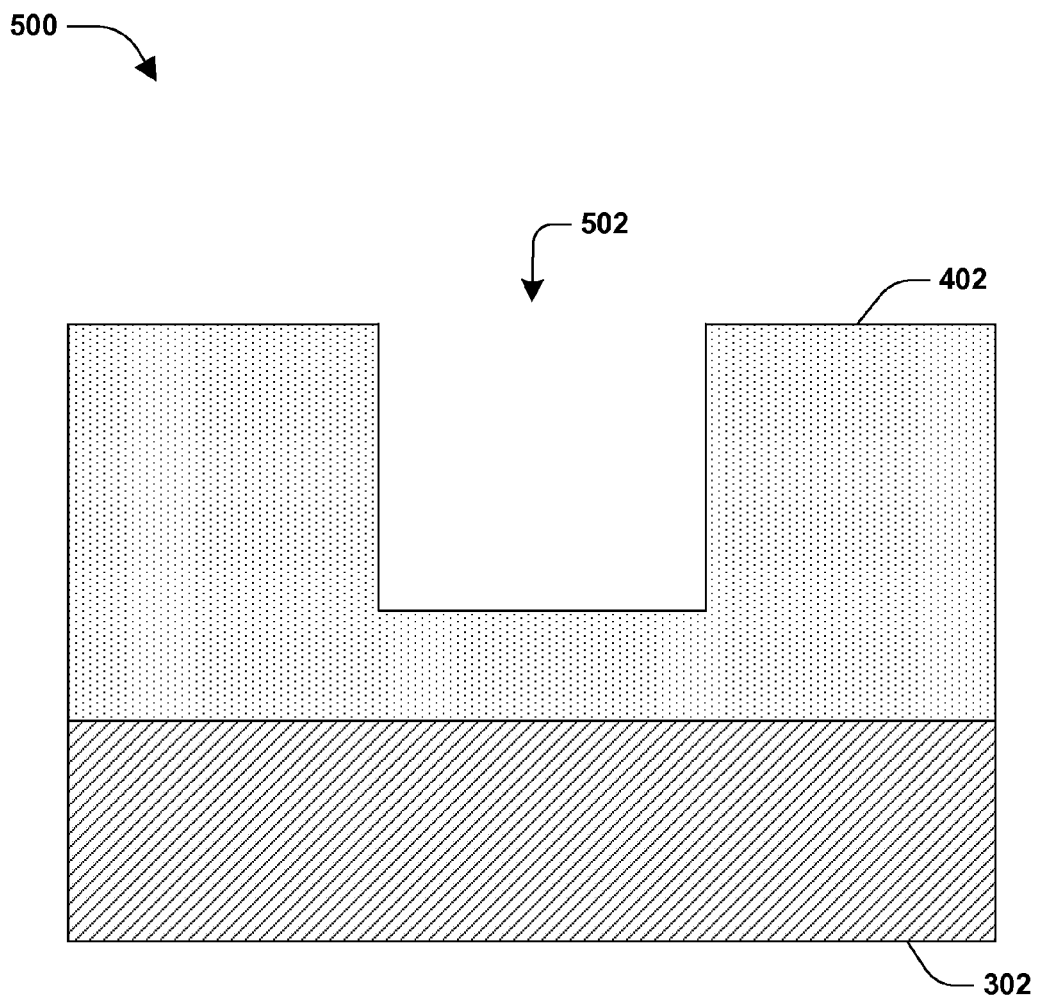
FIG. 5 is an illustration of at least some of an integrated circuit structure, according to some embodiments.

At 104, a trench 502 is formed within the dielectric layer 402, as illustrated in example 500 of FIG. 5. The trench 502 is formed to accommodate a subsequently formed conductive structure, such as a cooper via. In some embodiments, lithography techniques and a hardmask are used during a trench formation process, such as an etch process, used to form the trench 502, so that desired portions of the dielectric layer 402, such as portions not corresponding to the trench 502, are not removed by the etch process.

Figure 6:
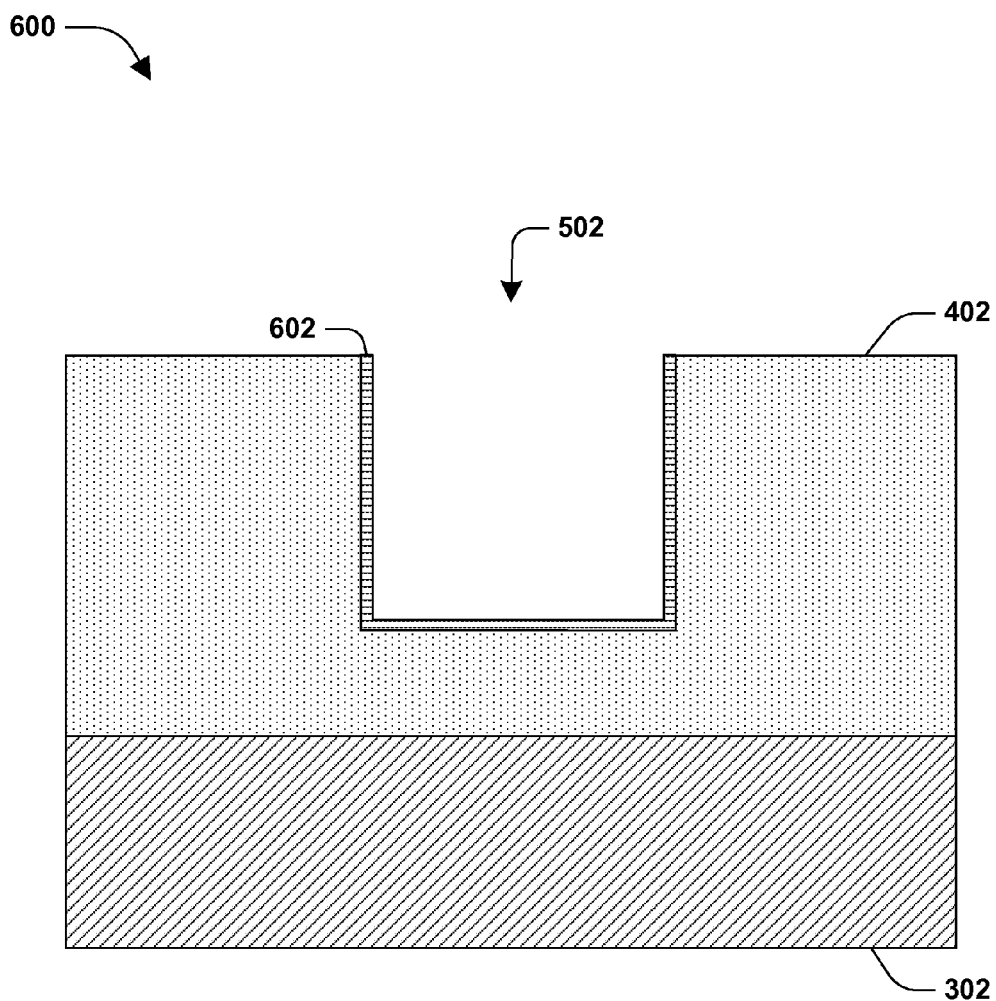
FIG. 6 is an illustration of at least some of an integrated circuit structure, according to some embodiments.

At 106, a barrier layer 602 is formed within the trench 502, as illustrated in example 600 of FIG. 6. The barrier layer 602 comprises, for example, at least some of at least one of tantalum, tantalum nitride, titanium, titanium-nitride or manganese. In some embodiments, the barrier layer 602 lines the trench 502, such as lining a bottom portion of the trench 502 and at least one sidewall of the trench 502. In some embodiments, the barrier layer 602 comprises a thickness of between about 10 Å to about 30 Å. In some embodiments, the barrier layer 602 is formed using a deposition process, such as chemical vapor deposition (CVD), plasma-enhanced chemical vapor deposition (PECVD), physical vapor deposition (PVD), or atomic layer deposition (ALD), at a temperature that is less than about 500° C., such as a temperature between about 200° C. to about 400° C. In some embodiments, a mask is used to cover portions of the integrated circuit structure that are not to have dielectric material formed thereon, such as portions of the dielectric layer 402 wherein the trench 502 is not formed.

It will be appreciated that CVD is a thin film deposition technique that exposes a substrate to one or more precursor chemicals. The one or more precursor chemicals react and decompose on a surface of the substrate, resulting in a deposition of a material. PECVD utilizes plasma to enhance the rate at which the one or more precursor chemicals react. In an example, PECVD allows for deposition of the material at a temperature that is relatively lower than a temperate of CVD. PVD is a thin film deposition technique in which desired material is deposited onto a surface by condensation of a vaporized form of the desired material. In an embodiment, PVD involves one or more physical processes, such as, for example, high temperature vacuum evaporation with subsequent condensation, or plasma sputter bombardment. In some embodiments, another variant of PVD, such as cathodic arc deposition, electron beam deposition or pulsed laser deposition, may be implemented. ALD is a thin film deposition technique that deposits successive layers of one or more source materials, such as source gases, to produce a layered film having a relatively uniform thickness. ALD is a conformal process resulting in the layered film having relatively uniform thickness as compared with other deposition techniques. In some embodiments, ALD involves one or more source materials, such as silane (SiH4) or Tetrafluorosilane (SiF4), that are used in sequential reactions within a reaction chamber to form the layered film. In some embodiments of ALD utilizing multiple source materials, a first source material is exposed in a first reaction to create a first layer, such as a relatively thin layer, on a wafer. The reaction chamber is then purged to remove contaminates or leftover particles from the first reaction. Then a second source material is exposed in a second reaction to form a second layer over the first layer. In this way, one or more layers are sequentially deposited on the wafer. In some embodiments of ALD utilizing a single source material, one or more deposition sequences are performed using a source gas, such as silane (SiH4), Tetrafluorosilane (SiF4), or other source gas. For example, a deposition sequence comprises a first SiH4 pulse, a first radio frequency (RF) sputtering on phase, a second SiH4 pulse, and a second RF sputter on phase. During an RF sputtering on phase, an RF power source is turned on, such that radio waves are transmitted through a material, resulting in ionization of gas atoms. Once ion gas atoms contact a material that is to be deposited, the material is broken into one or more pieces that form a thin film on a surface of a substrate.

Figure 7:
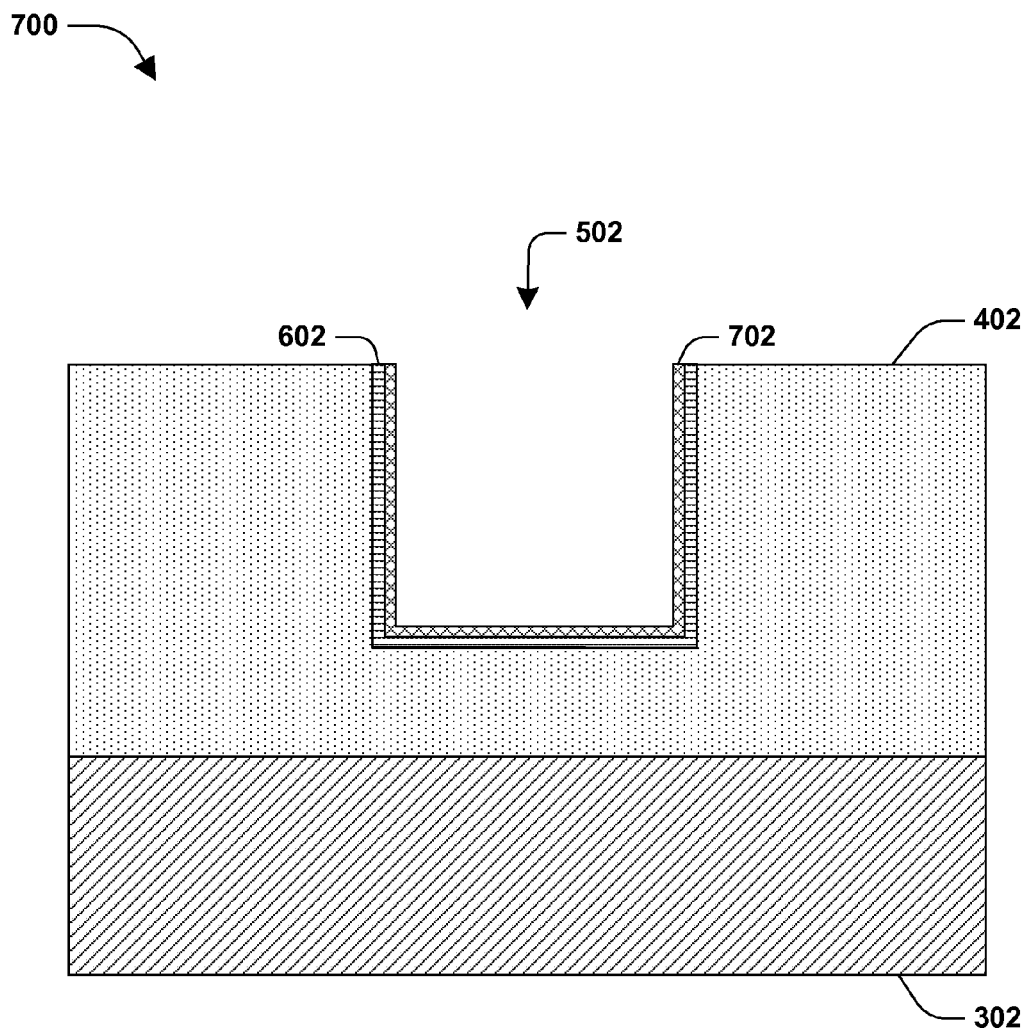
FIG. 7 is an illustration of at least some of an integrated circuit structure, according to some embodiments.

At 108, a liner 702 is formed over the barrier layer 602, as illustrated in example 700 of FIG. 7. In some embodiments, the liner 702 forms a liner over the barrier layer 602, such as near a bottom portion of the trench 502 and near at least one sidewall of the trench 502. The liner 702, for example, comprises at least some of at least one of cobalt, ruthenium, rhodium, gold, silver or osmium. In some embodiments, the liner 702 comprises a thickness of between about 10 Å to about 30 Å. It will be appreciated that at least one of the barrier layer 602 or the liner 702 are optional. Accordingly, while discussion of the barrier layer 602 and the liner 702 are included herein, one or both of these layers are omitted in some embodiments.

Figure 8:
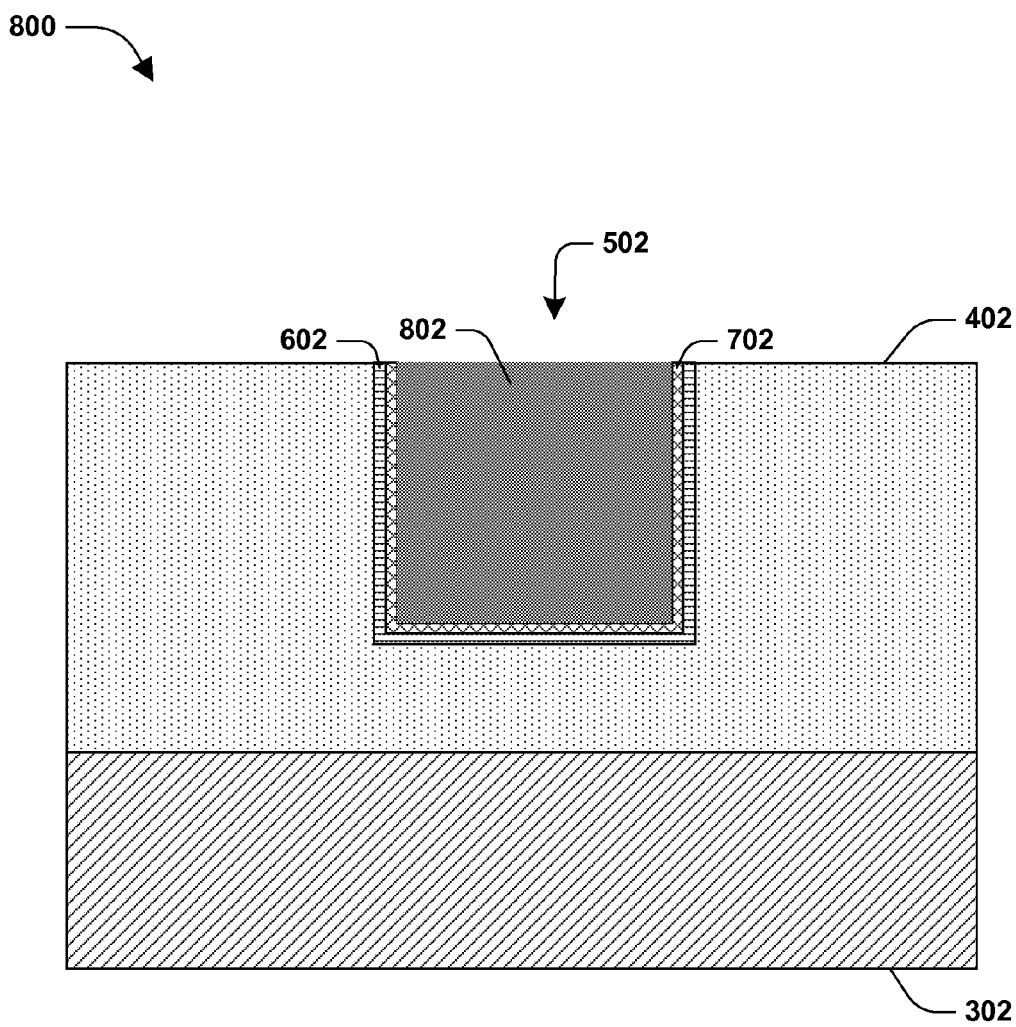
FIG. 8 is an illustration of at least some of an integrated circuit structure, according to some embodiments

At 110, conductive material is formed over the liner 702 within the trench 502 to create a conductive structure 802, as illustrated in example 800 of FIG. 8. In some embodiments, the conductive structure 802 comprises a conductive material, such as metal. For example, an electrochemical plating process is used to form the conductive structure 802 from copper or a copper alloy. In some embodiments, the conductive structure 802 comprises a height of between about 200 Å to about 2000 Å and a width of between about 100 Å to about 1000 Å. In some embodiments, there is substantial uniformity along a top surface of the conductive structure and a top surface of the dielectric layer 402.

Figure 9:
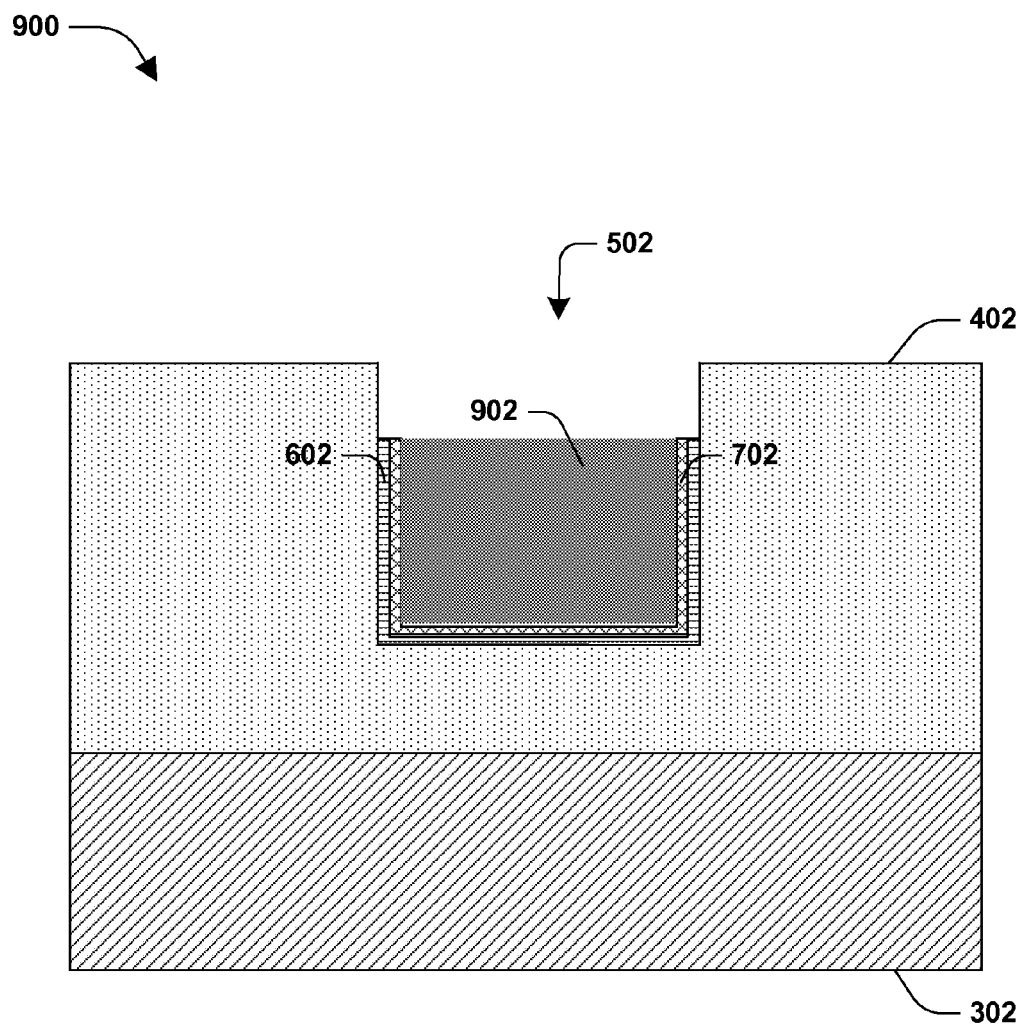
FIG. 9 is an illustration of at least some of an integrated circuit structure, according to some embodiments.
Figure 12:
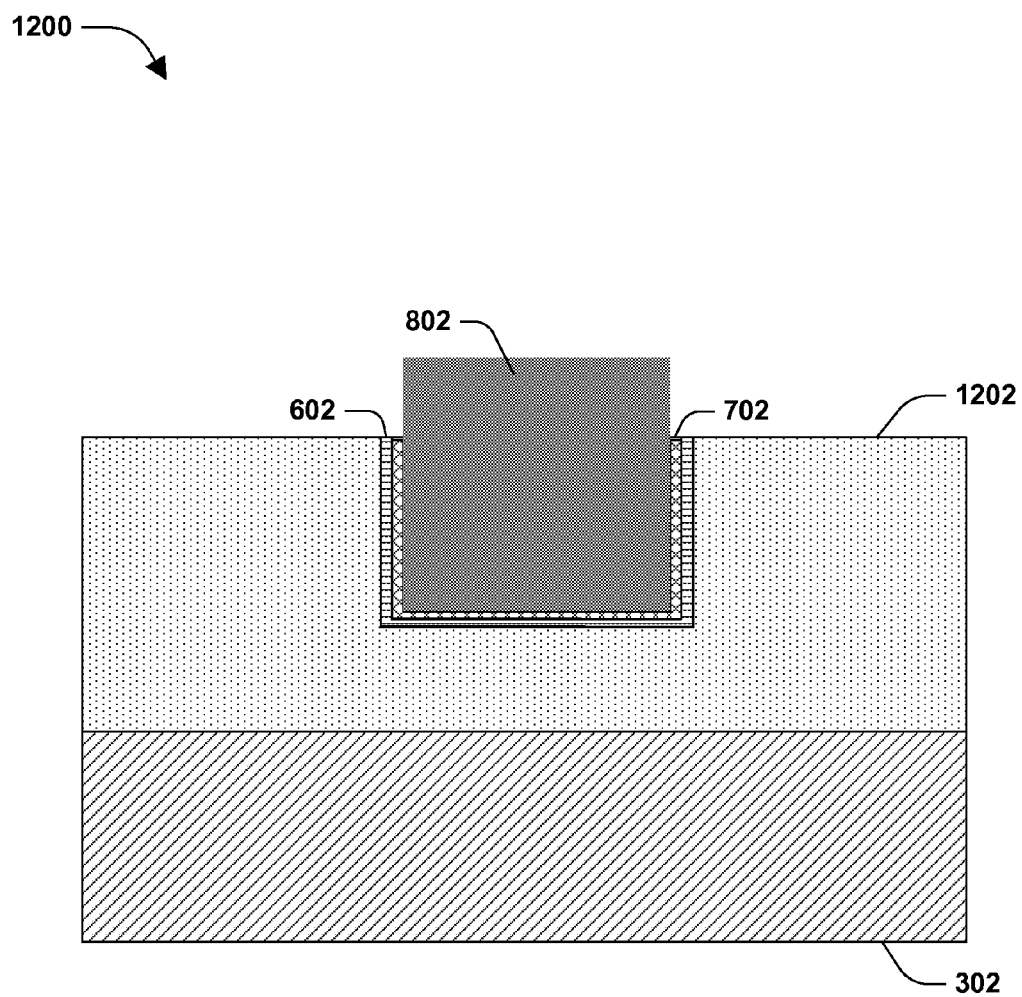
FIG. 12 is an illustration of at least some of an integrated circuit structure, according to some embodiments.

At 112, at least some of the dielectric layer 402 and at least some of the conductive structure 802 are removed, as illustrated in example 900 of FIG. 9 and in example 1200 of FIG. 12. The removal of at least some of the dielectric layer 402 and at least some of the conductive structure 802 is performed during a chemical mechanical polishing process to polish off conductive material and dielectric material. In an embodiment, a slurry is used to remove at least some of the dielectric layer 402 and at least some of the conductive structure 802. In some embodiments, the removal results in a difference in a level of a top surface of the conductive structure and a top surface of the dielectric layer 402. The slurry removes at least some of the dielectric layer 402 at a first removal rate, while the slurry removes at least some of the conductive structure 802 at a second removal rate. In some embodiments, the first removal rate is at least 10 times the second removal rate, while in other embodiments, the first removal rate is 1/10 or less the second removal rate.

In an embodiment, the first removal rate is less than the second removal rate, and as a result, at least some of conductive structure 802 is removed to result in conductive structure 902, as illustrated in example 900 of FIG. 9. The top surface of the conductive structure 902 has a level lower than the top surface of the dielectric layer 402. That is, the top surface of the conductive structure 902 is a first distance from the top surface of the substrate 302 while a top surface of the dielectric layer 402 is a second distance from the top surface of the substrate 302, where the first distance is less than the second distance. In an embodiment, a difference between the first distance and the second distance is between about 20 Å to about 200 Å. In some embodiments, given the slurry or etch chemistries used, the barrier layer 602 and the liner 702 are generally removed at or near the second removal rate so as to be substantially flush with the top surface of the conductive structure 902. It will be appreciated that by removing the barrier layer 602 and the liner 702, areas where peeling between at least one of the dielectric layer 402, the barrier layer 602, the liner 702 and the conductive structure 902 occurs are generally removed. Peeling between such layers introduces reliability issues, and thus removing areas where such peeling occurs enhances reliability of a resulting integrated circuit, for example.

Figure 10:
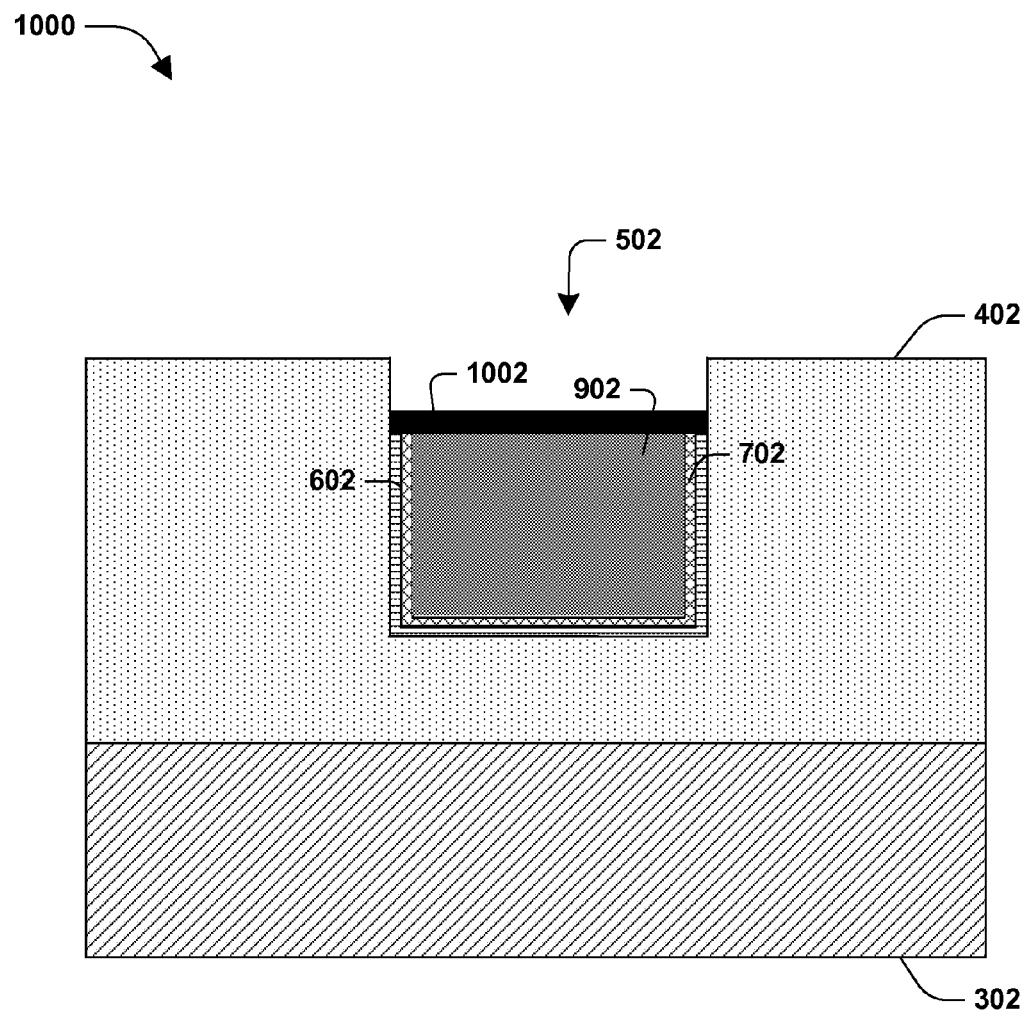
FIG. 10 is an illustration of at least some of an integrated circuit structure, according to some embodiments.
Figure 11:
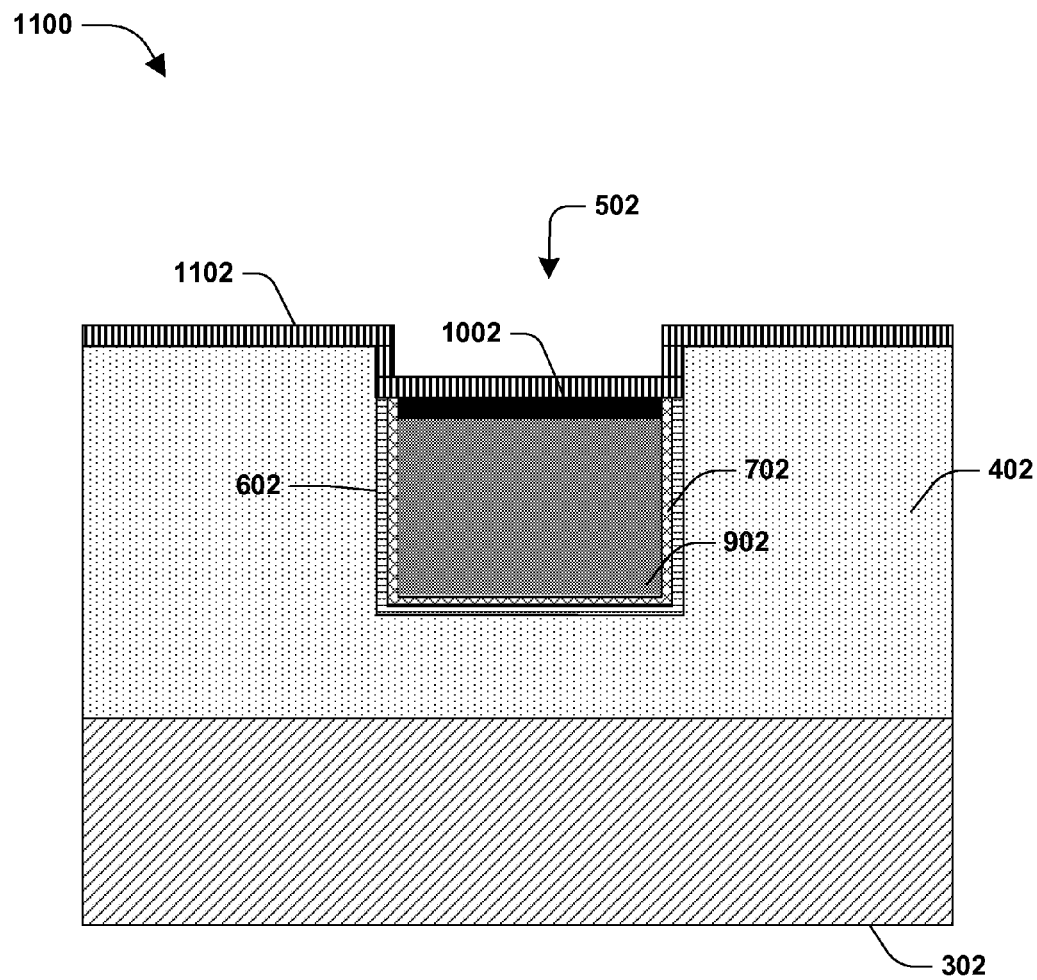
FIG. 11 is an illustration of at least some of an integrated circuit structure, according to some embodiments.

In some embodiments, a conductive cap 1002 is formed over the conductive structure 902, as illustrated in example 1000 of FIG. 10. The conductive cap 1002, for example, comprises at least some of at least one of cobalt, ruthenium, or nickel. In some embodiments, the conductive cap 1002 comprises a thickness of between about 10 Å to about 30 Å. In some embodiments, a film 1102 is formed over the conductive cap 1002 and at least some of the dielectric layer 402, as illustrated in example 1100 of FIG. 11. The film 1102, for example, lines a top surface of the conductive cap 1002, and at least one sidewall of the liner 702.

In an embodiment, the first removal rate is greater than the second removal rate, and as a result, at least some of dielectric layer 402 is removed to result in dielectric layer 1202, as illustrated in example 1200 of FIG. 12. The top surface of the dielectric layer 1202 has a level lower than the top surface of the conductive structure 802. That is, the top surface of the conductive structure 802 is a first distance from the top surface of the substrate 302 while a top surface of the dielectric layer 1202 is a second distance from the top surface of the substrate 302, where the first distance is greater than the second distance. In an embodiment, a difference between the first distance and the second distance is between about 20 Å to about 200 Å, and results in a step height. In some embodiments, given the slurry or etch chemistries used, the barrier layer 602 and the liner 702 are generally removed at or near the first removal rate so as to be substantially flush with the top surface of the dielectric layer 1202. It will be appreciated that by removing the barrier layer 602 and the liner 702, areas where peeling between at least one of the dielectric layer 402, the barrier layer 602, the liner 702 and the conductive structure 902 occurs are generally removed. Peeling between such layers introduces reliability issues, and thus removing areas where such peeling occurs enhances reliability of a resulting integrated circuit, for example.

Figure 13:
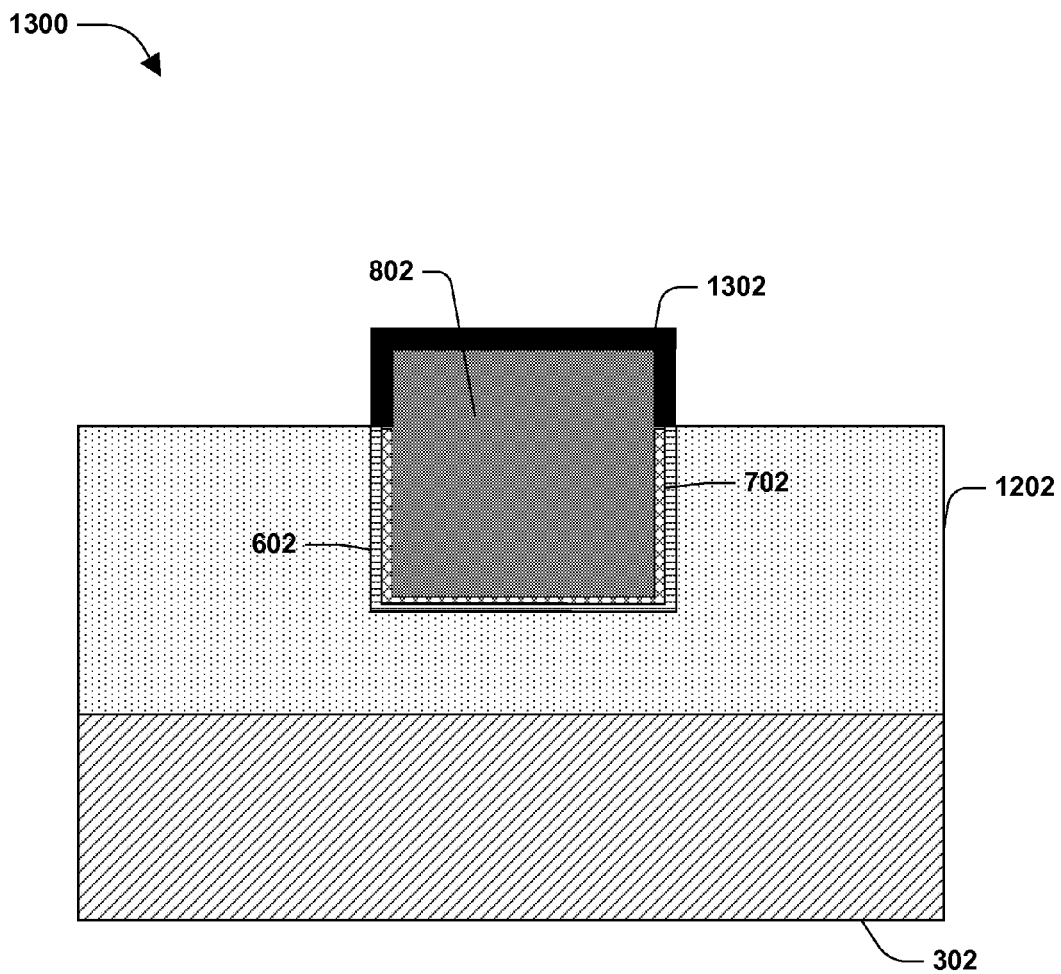
FIG. 13 is an illustration of at least some of an integrated circuit structure, according to some embodiments.
Figure 14:
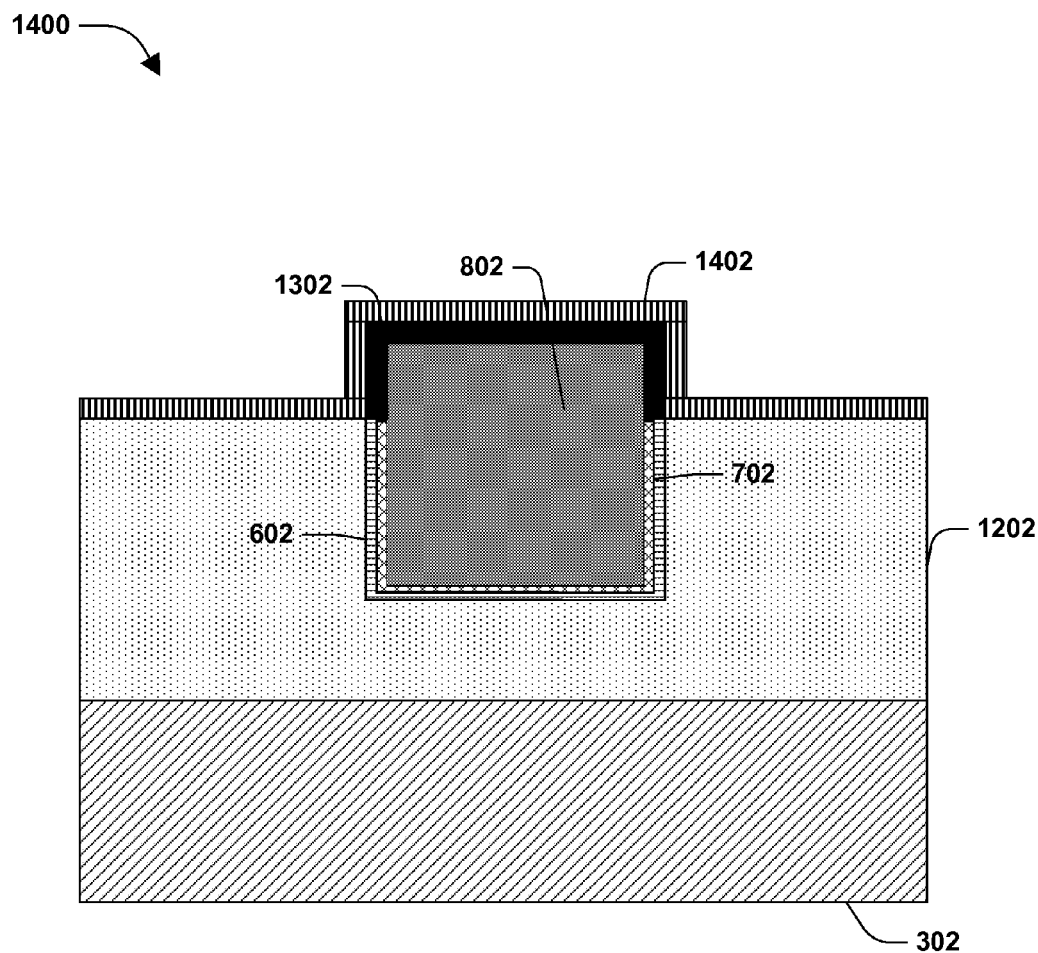
FIG. 14 is an illustration of at least some of an integrated circuit structure, according to some embodiments.

In some embodiments, a conductive cap 1302 is formed over the conductive structure 802 and at least some of the dielectric layer 1202, as illustrated in example 1300 of FIG. 13. The conductive cap 1302 forms in a conformal manner over the conductive structure 802 and, for example, lines a top surface of the conductive structure 802 and at least one sidewall of the conductive structure 802. The conductive cap 1302, for example, comprises at least some of at least one of cobalt, ruthenium, or nickel. In some embodiments, the conductive cap 1302 comprises a thickness of between about 10 Å to about 30 Å. In some embodiments, a film 1402 is formed over the conductive cap 1302, as illustrated in example 1400 of FIG. 14. The film 1102, for example, lines a top surface of the conductive cap 1002, and at least one sidewall of the conductive cap 1302 that lines at least one sidewall of the conductive structure 802.

In an embodiment, an inline chemical mechanical polishing control system takes one or more measurements corresponding to the integrated circuit structure and provides feedback at least one of before, during, or after at least some of the removal of the dielectric layer 402 or 1202, and the conductive structure 802 or 902. For example, a first distance from the top surface of the conductive structure 802 or 902 to the top surface of the substrate 302, a second distance from the top surface of the dielectric layer 402 or 1202 to the top surface of the substrate 302, a difference between the first distance and the second distance, or a change in at least one of the first distance, the second distance, or the difference is measured. A chemical mechanical polishing of at least some of the integrated circuit structure is modified based upon feedback indicative of one or more measurements. For example, first feedback results in an increase or acceleration, decrease or deceleration, continuation, or ceasing of removal of at least some of the dielectric layer 402 or 1202. In another example, second feedback results in an increase or acceleration, decrease or deceleration, continuation, or ceasing of removal of at least some of the conductive structure 802 or 902.

In some embodiments, a top surface of the conductive structure 802 or 902 is a first distance from a top surface of the substrate 302 and the top surface of the conductive structure 802 or 902 is a second distance from a top surface of the dielectric layer 402 or 1202, where the first distance is different than the second distance. In an embodiment, the integrated circuit structure is formed using metal or non-metal chemical mechanical polishing applications.

Figure 2:
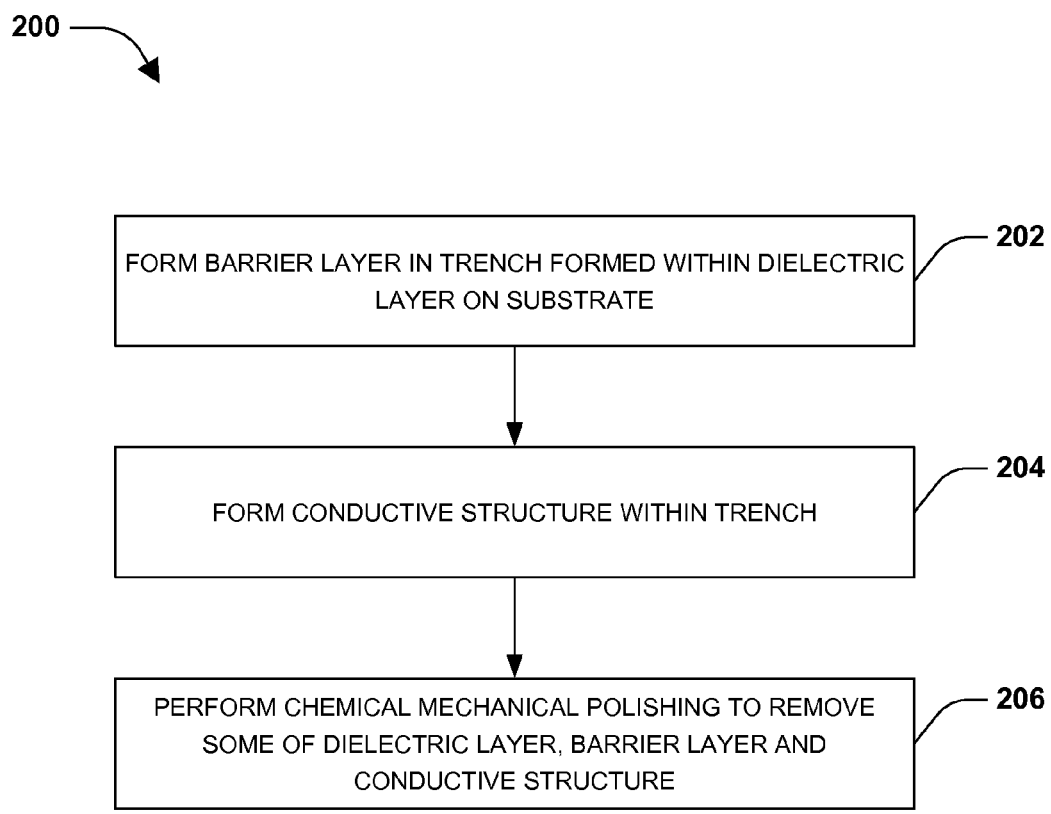
FIG. 2 is a flow diagram illustrating a method of forming an integrated circuit structure, according to some embodiments.
Figure 3:
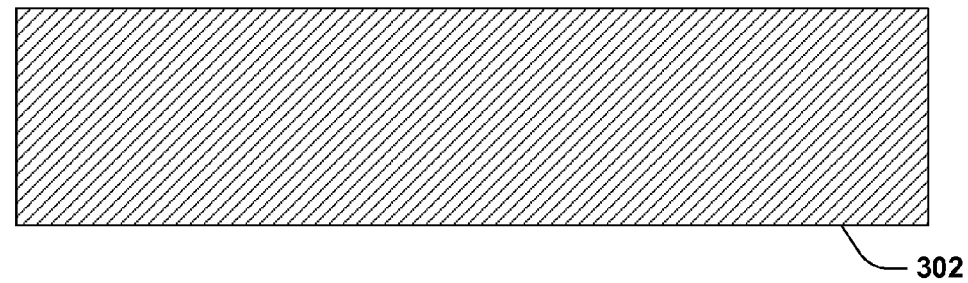
FIG. 3 is an illustration of at least some of an integrated circuit structure, according to some embodiments.
Figure 4:
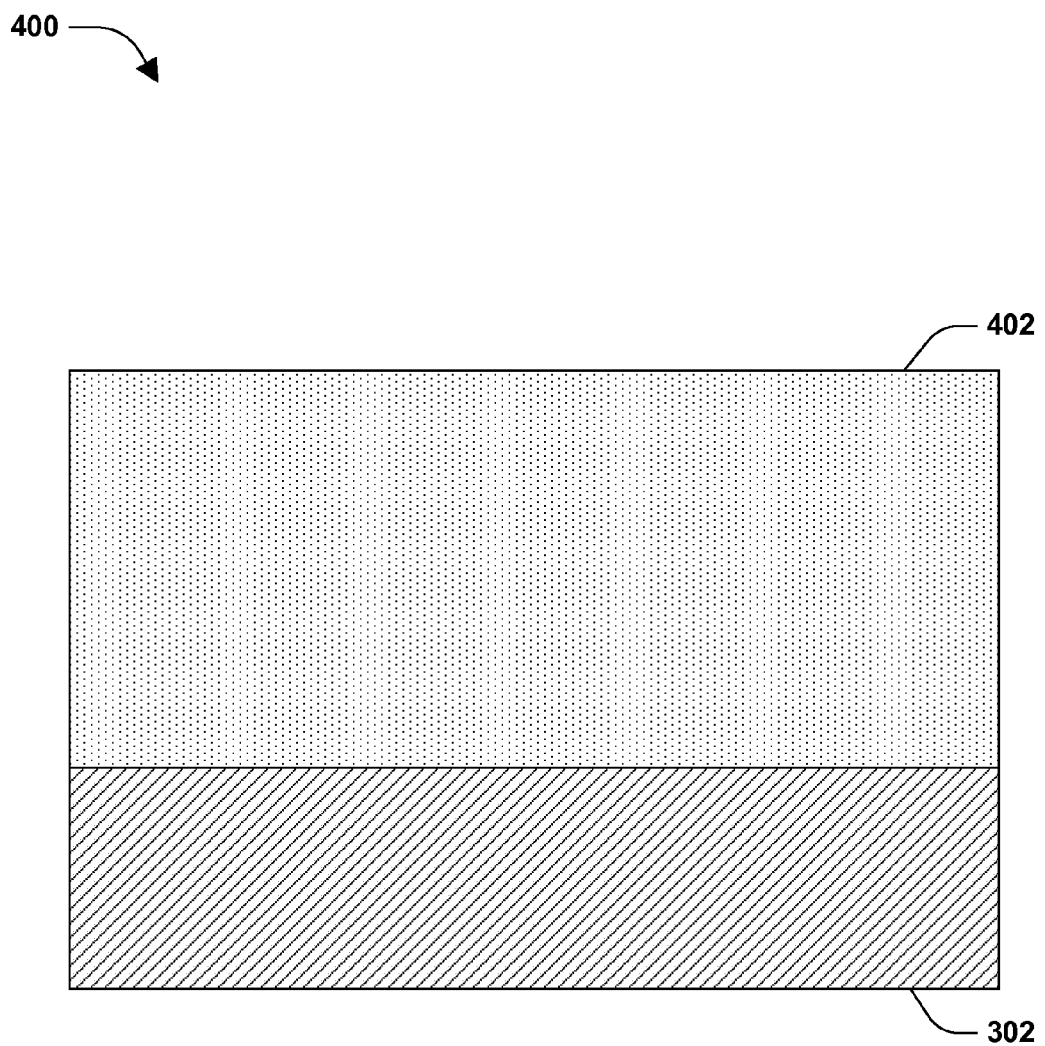
FIG. 4 is an illustration of at least some of an integrated circuit structure, according to some embodiments.

A method 200 of forming an integrated circuit structure, according to some embodiments, is illustrated in FIG. 2, and one or more integrated circuit structures formed by such a methodology are illustrated in FIGS. 6, 8, 9 and 12. It will be appreciated that method 200 illustrates that liner 707 is optional. At 202, barrier layer 602 is formed in a trench 502 formed within a dielectric layer 402 on a substrate 302 of an integrated circuit structure, as illustrated in example 600 of FIG. 6. At 204, a conductive structure 802 is formed within the trench 502, as illustrated in example 800 of FIG. 8. At 206, chemical mechanical polishing is performed to remove at least some of the dielectric layer 402, at least some of the barrier layer 602, and at least some of the conductive structure 802, as illustrated in example 900 of FIG. 9 or in example 1200 of FIG. 12.

It will be appreciated that while reference is made herein to a trench, the instant disclosure is not limited to the same. For example, more than one type of opening is within the contemplated scope of the present disclosure. For example, the techniques disclosed herein are applicable to via openings and any other openings. Accordingly, the use of "trench" herein, including within the claims, is intended to cover via openings as well as any other suitable openings. For example, forming a trench, forming a liner within the trench, etc. is intended to cover forming a via opening, forming a liner within the via opening, etc. Effectively, substituting "via opening" or any other type of suitable opening for "trench" is within the contemplated scope of the present disclosure. Also, the use of "trench" herein is not intended to limit the instant application, including the appended claims, to any particular process such as a single damascene process, a dual damascene process, etc. That is, the instant application, including the appended claims, is intended to cover any one or more of such processes.

According to an aspect of the instant disclosure, a method for forming an integrated circuit structure is provided. The method comprises, forming a dielectric layer on a substrate. A trench is formed within the dielectric layer. A conductive structure is formed within the trench. At least some of the dielectric layer and the conductive structure are removed concurrently. The dielectric layer is removed at a first removal rate and the conductive structure is removed at a second removal rate. The first removal rate is at least one of greater than about 10 times the second removal rate, or less than about 1/10 the second removal rate.

According to an aspect of the instant disclosure, an integrated circuit structure is provided. The integrated circuit structure comprises a conductive structure in a trench formed within a dielectric layer on a substrate. A top surface of the conductive structure is a first distance from a top surface of the substrate. A top surface of the dielectric layer is a second distance from the top surface of the substrate. The first distance is at least one of greater than the second distance or less than the second distance. A conductive cap is formed on the top surface of the conductive structure.

According to an aspect of the instant disclosure, a method for forming an integrated circuit structure is provided. The method comprises, forming a barrier layer in a trench formed within a dielectric layer on a substrate. A conductive structure is formed within the trench. Chemical mechanical polishing is performed to remove at least some of the dielectric layer, the barrier layer and the conductive structure. A top surface of the conductive structure is a first distance from a top surface of the substrate, a top surface of the dielectric layer is a second distance from the top surface of the substrate, and the first distance is at least one of greater than the second distance or less than the second distance.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for forming an integrated circuit structure, comprising:
    forming a dielectric layer on a substrate;
    forming a trench within the dielectric layer;
    forming a conductive structure within the trench;
    concurrently removing at least some of the dielectric layer and the conductive structure, the dielectric layer removed at a first removal rate and the conductive structure removed at a second removal rate, the first removal rate at least one of:
        greater than about 10 times the second removal rate; or
        less than about 1/10 the second removal rate; and
    measuring, after at least some of the concurrently removing, a change in at least one of:
        a first distance from a top surface of the conductive structure to a top surface of the substrate;
        a second distance from a top surface of the dielectric layer to the top surface of the substrate; or
        a difference between the first distance and the second distance.

2. The method of claim 1, further comprising:
    forming a barrier layer within the trench; and
    forming a liner over the barrier layer, and wherein the forming a conductive structure comprises forming the conductive structure over the liner.

3. The method of claim 1, the concurrently removing performed such that:
    the first distance is at least one of greater than the second distance or less than the second distance.

4. The method of claim 1, the concurrently removing comprising using a slurry associated with at least one of the first removal rate or the second removal rate.

5. The method of claim 1, further comprising:
    forming a conductive cap on a sidewall of the conductive structure when the first distance is greater than the second distance.

6. The method of claim 1, the concurrently removing performed such that:
    the top surface of the conductive structure is a distance from the top surface of the dielectric layer, and the distance is between about 20 Å to about 200 Å.

7. The method of claim 1, further comprising:
    based upon the measuring, at least one of:
        continuing to perform the concurrently removing;
        modifying the concurrently removing; or
        stopping the concurrently removing.

8. An integrated circuit structure, comprising:
    a conductive structure in a trench formed within a dielectric layer on a substrate, a top surface of the conductive structure a first distance from a top surface of the substrate, a top surface of the dielectric layer a second distance from the top surface of the substrate, the first distance less than the second distance;
    a conductive cap formed on the top surface of the conductive structure and within the trench; and
    a conformal film formed over the conductive cap and over at least some of the dielectric layer.

9. The integrated circuit structure of claim 8, the conductive structure comprising a different conductive material than the conductive cap.

10. The integrated circuit structure of claim 8, the conductive cap comprising at least one of cobalt, ruthenium, or nickel.

11. The integrated circuit structure of claim 8, comprising a barrier layer in the trench and between the conductive structure and the dielectric layer, a top surface of the barrier layer the first distance from the top surface of the substrate.

12. The integrated circuit structure of claim 8, the first distance between about 20 Å to about 200 Å less than the second distance.

13. The integrated circuit structure of claim 11, comprising a liner in the trench and between the conductive structure and the barrier layer, a top surface of the liner the first distance from the top surface of the substrate.

14. A method for forming an integrated circuit structure, comprising:
    forming a barrier layer in a trench formed within a dielectric layer on a substrate;
    forming a conductive structure within the trench; and
    performing chemical mechanical polishing to remove at least some of the dielectric layer, the barrier layer and the conductive structure, the performing comprising:
        removing the at least some of the dielectric layer at a first rate while concurrently removing the at least some the conductive structure at a second rate, the first rate different than the second rate such that, responsive to the performing, a top surface of the conductive structure is a first distance from a top surface of the substrate, a top surface of the dielectric layer is a second distance from the top surface of the substrate, and the first distance at least one of greater than the second distance or less than the second distance.

15. The method of claim 14, the barrier layer comprising at least one of tantalum, titanium or manganese.

16. The method of claim 14, further comprising:
   forming a liner over the barrier layer and wherein the forming a conductive structure comprises forming the conductive structure over the liner.

17. The method of claim 16, the liner comprising at least one of cobalt, ruthenium, rhodium, gold, silver or osmium.

18. The method of claim 14, further comprising:
   measuring a change in at least one of height or thickness of at least one of the dielectric layer, the barrier layer, or the conductive structure after at least some of the chemical mechanical polishing.

19. The method of claim 14, further comprising:
   forming a conformal film over the conductive structure and at least some of the dielectric layer.

20. The method of claim 16, the performing comprising:
   removing at least some of the liner at the first rate.

\* \* \* \* \*